United States Patent
Krogstrup Jeppesen et al.

(10) Patent No.: US 11,629,430 B2
(45) Date of Patent: Apr. 18, 2023

(54) FABRICATION PROCESS USING VAPOUR DEPOSITION THROUGH A POSITIONED SHADOW MASK

(71) Applicant: Microsoft Technology Licensing, LLC, Redmond, WA (US)

(72) Inventors: Peter Krogstrup Jeppesen, Copenhagen (DK); Tomas Stankevic, Copenhagen (DK)

(73) Assignee: Microsoft Technology Licensing, LLC, Redmond, WA (US)

( * ) Notice: Subject to any disclaimer, the term of this patent is extended or adjusted under 35 U.S.C. 154(b) by 24 days.

(21) Appl. No.: 16/957,030

(22) PCT Filed: Dec. 29, 2017

(86) PCT No.: PCT/EP2017/084833
§ 371 (c)(1),
(2) Date: Jun. 22, 2020

(87) PCT Pub. No.: WO2019/129364
PCT Pub. Date: Jul. 4, 2019

(65) Prior Publication Data
US 2020/0392644 A1 Dec. 17, 2020

(51) Int. Cl.
*C23C 14/04* (2006.01)
*C30B 23/04* (2006.01)
(Continued)

(52) U.S. Cl.
CPC ............ *C30B 23/04* (2013.01); *C23C 14/042* (2013.01); *C23C 14/28* (2013.01); *C23C 14/54* (2013.01); *G06N 10/00* (2019.01); *H01L 39/24* (2013.01)

(58) Field of Classification Search
CPC ..... H01L 21/682; C23C 14/042; C23C 14/54; C23C 14/547; C23C 16/04
See application file for complete search history.

(56) References Cited

U.S. PATENT DOCUMENTS 3,494,853 A * 2/1970 Anderson ............. C23C 14/042
204/298.11
3,783,520 A 1/1974 King
(Continued)

FOREIGN PATENT DOCUMENTS

CN 102459687 A 5/2012
EP 2243855 10/2010
(Continued)

OTHER PUBLICATIONS

International Search Report and Written Opinion dated Oct. 2, 2018, from International Patent Application No. PCT/EP2017/084833, 13 pp.
(Continued)

*Primary Examiner* — Jaehwan Oh
(74) *Attorney, Agent, or Firm* — Klarquist Sparkman, LLP

(57) ABSTRACT

A method of fabrication in a vacuum chamber. The method comprises: deploying the wafer within the vacuum chamber; applying a mask in a first position over the wafer in the vacuum chamber; following this, performing a first fabrication step comprising projecting material onto the wafer through the mask while in vacuum in the vacuum chamber; then operating a mask-handling mechanism deployed within the vacuum chamber in order to reposition the mask to a second position while remaining in vacuum in the vacuum chamber, wherein the repositioning comprises receiving readings from one or more sensors sensing a current position of the mask and based thereon aligning the current position of the mask to the second position; and following this repositioning, performing a second fabrication step comprising projecting material onto the wafer through patterned openings in the repositioned mask while still maintaining the vacuum in the vacuum chamber.

20 Claims, 6 Drawing Sheets

(51) Int. Cl.
*G06N 10/00* (2022.01)
*C23C 14/28* (2006.01)
*C23C 14/54* (2006.01)
*H01L 39/24* (2006.01)

(56) References Cited

U.S. PATENT DOCUMENTS

| | | | | |
|---|---|---|---|---|
| 5,553,110 | A * | 9/1996 | Sentoku | G03F 1/22 430/5 |
| 8,815,013 | B2 * | 8/2014 | Chiang | C23C 16/52 118/721 |
| 2002/0080365 | A1 * | 6/2002 | Monshouwer | G03F 9/7015 356/508 |
| 2014/0318450 | A1 * | 10/2014 | Endo | H01L 21/67769 118/696 |
| 2015/0184287 | A1 * | 7/2015 | Tsung | C23C 16/04 427/255.28 |

FOREIGN PATENT DOCUMENTS

| | | |
|---|---|---|
| GB | 978984 | 1/1965 |
| JP | S57-7925 | 1/1982 |

OTHER PUBLICATIONS

"First Office Action and Search Report Issued in Chinese Patent Application No. 201780097735.2", dated Nov. 22, 2021, 13 Pages.
"Office Action Issued in Indian Patent Application No. 202047021124", dated Mar. 9, 2022, 5 Pages.
Dec. 29, 2017, PCT/EP17/084833, Jul. 4, 2019, WO2019/129364.
Dec. 29, 2017, 201780097735.2, Jun. 15, 2020, Jul. 31, 2020, CN111479947A.
Dec. 29, 2017, 17826532.8, Jun. 26, 2020, Sep. 30, 2020, 3714080.
Dec. 29, 2017, 202047021124, May 19, 2020, Jun. 26, 2020, 202047021124A.
Nov. 30, 2017, 201780092102.2, Dec. 12, 2019, Jan. 31, 2020, CN110741486A.
Nov. 30, 2017, 17808439.8, Dec. 3, 2019, Apr. 22, 2020, 3639302.
Nov. 30, 2017, 201947046467, Nov. 14, 2019, Nov. 22, 2019, 201947046467A.
Nov. 30, 2017, 2019-571656, Dec. 25, 2019, Aug. 27, 2020, P2020-526021A.
Nov. 30, 2017, 10-2020-7002956, Jan. 30, 2020, Feb. 21, 2020, 10-2020-0019247.
Nov. 30, 2017, U.S. Appl. No. 16/627,703, Dec. 30, 2019, Jun. 4, 2020, US-2020-0176663-A1.
Jun. 30, 2017, U.S. Appl. No. 62/527,875.
Nov. 30, 2017, PCT/EP17/081038, Jan. 3, 2019, WO2019/001753.
Dec. 28, 2020, U.S. Appl. No. 17/135,632, Apr. 22, 2021, US-2021-0119125-A1, Aug. 23, 2022, U.S. Pat. No. 11,424,409.
Jan. 11, 2019, U.S. Appl. No. 16/246,287, Jul. 16, 2020, US-2020-0227636-A1, Dec. 29, 2020, U.S. Pat. No. 10,879,464.
Jul. 29, 2019, 19748783.8, Jan. 19, 2022, Apr. 27, 2022, 3987077.
Jul. 29, 2019, 10-2021-7041226, Dec. 15, 2021, Mar. 28, 2022, 10-2022-0038286.
Jul. 29, 2019, U.S. Appl. No. 17/597,838, Jan. 25, 2022, Aug. 18, 2022, US-2022-0260915-A1.
Jul. 29, 2019, PCT/EP19/070387, Feb. 4, 2021, WO2021/018379.
Aug. 11, 2020, 20761683.0, Feb. 7, 2022, May 11, 2022, 3994838.
Aug. 11, 2020, U.S. Appl. No. 17/634,233, Feb. 9, 2022, Sep. 1, 2022, US-2022-0277216-A1.
Aug. 12, 2019, U.S. Appl. No. 62/885,715.
Aug. 11, 2020, PCT/US20/045791, Feb. 18, 2021, WO2021/030363.
Sep. 16, 2019, 19769791.5, Mar. 14, 2022, Jul. 27, 2022, 4032119.
Sep. 16, 2019, U.S. Appl. No. 17/753,820, Mar. 15, 2022.
Sep. 16, 2019, PCT/EP19/074704, Mar. 25, 2021, WO2021/052559.
Dec. 5, 2019, 201980102748.3, Jun. 2, 2022, Jul. 12, 2022, CN114747014A.
Dec. 5, 2019, 10-2022-7017934, May 26, 2022, Aug. 4, 2022, 10-2022-0109400.
Dec. 5, 2019, U.S. Appl. No. 17/756,815, Jun. 2, 2022.
Dec. 5, 2019, PCT/EP19/083904, Jun. 10, 2021, WO2021/110274.
Dec. 5, 2019, U.S. Appl. No. 17/756,813, Jun. 2, 2022.
Dec. 5, 2019, PCT/EP19/083906, Jun. 10, 2021, WO2021/110275.
Dec. 4, 2020, 202080084194.1, Jun. 2, 2022, Jul. 22, 2022, CN114788026A.
Dec. 4, 2020, 10-2022-7021272, Jun. 22, 2022, Aug. 4, 2022, 10-2022-0109419.
Dec. 23, 2021, U.S. Appl. No. 17/561,330, May 12, 2022, US-2022-0149262-A1.
Feb. 20, 2020, U.S. Appl. No. 16/796,671, Jun. 10, 2021, US-2021-0175408-A1, Dec. 28, 2021, U.S. Pat. No. 11,211,543.
Dec. 5, 2019, U.S. Appl. No. 62/944,093.
Dec. 4, 2020, PCT/US20/063459, Jun. 10, 2021, WO2021/113746.
Nov. 11, 2020, PCT/EP20/081723, Mar. 17, 2022, WO2022/053170.
Dec. 4, 2020, PCT/EP20/084618, Jun. 9, 2022, WO2022/117206.
Jan. 13, 2021, PCT/EP21/050587, Jul. 21, 2022, WO2022/152373.
"Second Office Action Issued in Chinese Patent Application No. 201780097735.2", dated Jun. 8, 13 Pages.
"Office Action and Search Report Issued in Chinese Patent Application No. 201780097735.2", dated Dec. 27, 2022, 22 Pages.
Junbiao, et al., "The Precision Workbench Technology in Micro-Nano Machining", In Publication of University of Technology of Press, Dec. 31, 2004, 6 Pages.

* cited by examiner

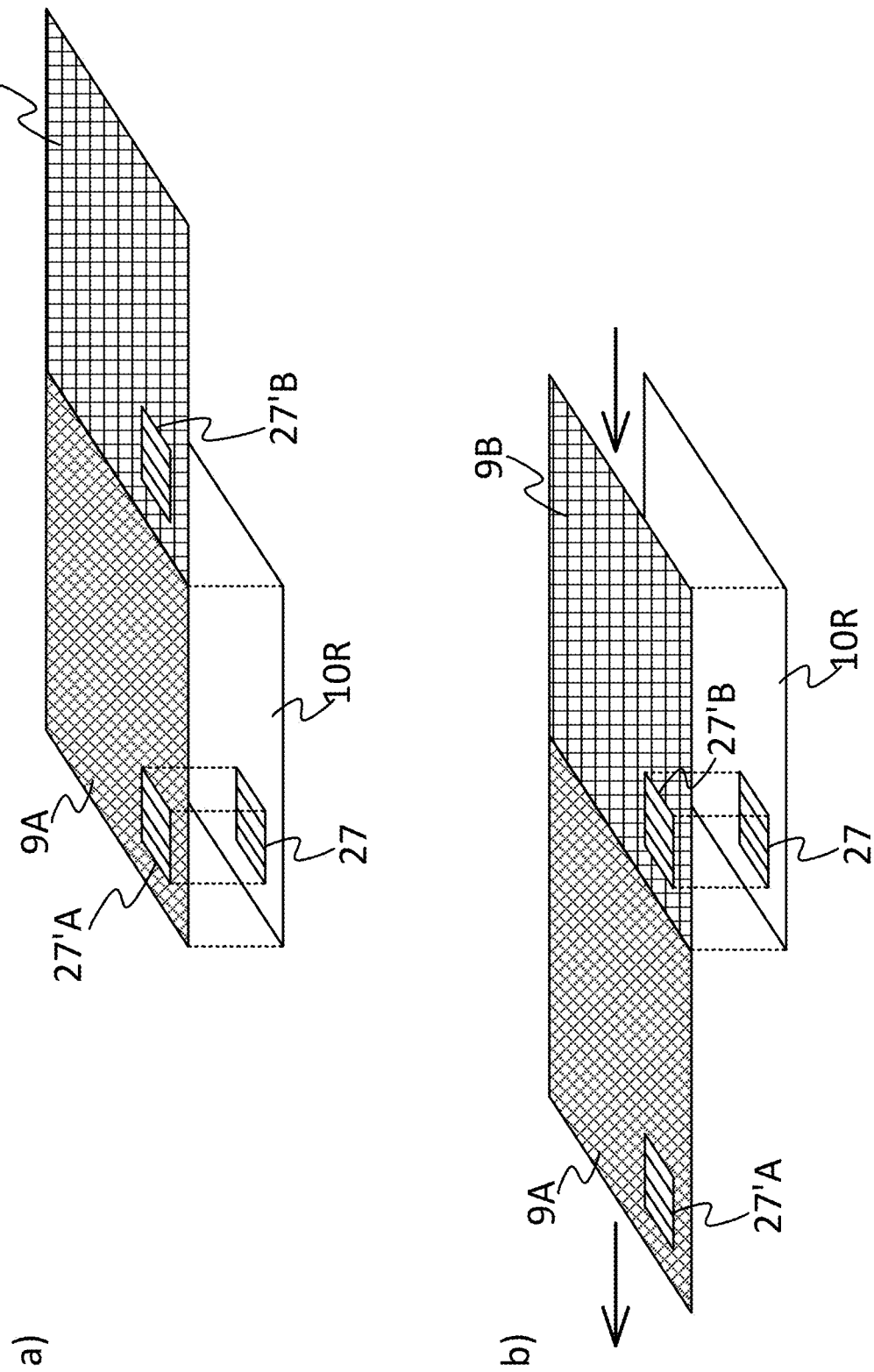

FABRICATION PROCESS USING VAPOUR DEPOSITION THROUGH A POSITIONED SHADOW MASK

CROSS REFERENCE TO RELATED APPLICATIONS

This application is the U.S. National Stage of International Application No. PCT/EP2017/084833, filed Dec. 29, 2017, which was published in English under PCT Article 21(2).

BACKGROUND

In the fabrication of microscale and nanoscale devices such as semiconductor dies, quantum computing devices and optical waveguide structures, this will typically involve building up a wafer through the deposition of multiple layers of material in different patterns over a substrate. The overall process will involve multiple steps as the different layers are built up. Though the terminology is not always used consistently in the art, for the present purposes the "substrate" will be taken herein to refer to the base layer, and the "wafer" will refer to the substrate plus any other layers already deposited over the substrate at the current stage in the fabrication process.

For example in the fabrication of a traditional semiconductor device, the substrate comprises a semiconductor such as silicon with differently doped n- and p-type regions. The material being deposited at any given subsequent layer may then for example be a conductor, a further layer of semiconductor, or a dielectric or other insulator (with different kinds of material typically being deposited at different respective layers). In the case of fabricating a quantum electronic device such as a quantum computing device, the substrate may be a semiconductor or an insulator, and the deposited materials may be conductors, insulators, semiconductors and/or superconductors. For instance as a basis for a quantum circuit, lines of semiconductor are formed over an insulating substrate, and then a coating of superconductor is formed over the semiconductor lines to form a network of semiconductor-superconductor nanowires.

Vacuum deposition refers to fabrication techniques whereby a layer of material is deposited onto a substrate while in vacuum within a vacuum chamber. The material may for example be deposited in the form of a molecular or atomic beam flux (directional). The material is initially deployed in its source form (e.g. liquid or solid) in a source cell, which is located in the vacuum chamber or has an opening into the vacuum chamber. The material is then energized in the source cell such as through heating or ionization, causing it to be projected from the source cell through the vacuum toward the wafer, which is also deployed in the vacuum chamber. For instance one form of vacuum deposition is molecular beam epitaxy. In this case a source cell is arranged to heat the source material, causing it to evaporate or sublime. The source cell is arranged to eject the evaporated or sublimated molecules or atoms through the vacuum toward the wafer in the form of a molecular or atomic beam. The particles then condense on the wafer in a crystalline form. Other forms of vacuum deposition are also known, such as chemical beam epitaxy, or thin film deposition systems (e.g. E-beam evaporation, thermal evaporation or Ion milling). Various forms of vacuum deposition and the various material that can be deposited to form various kinds of structure will, in themselves, be familiar to a person skilled in the art.

To form the desired pattern, the traditional approach is lithography which uses a photo resist as a mask. A patterned photo resist, i.e. a photo mask, is deposited on the wafer and then a pattern is defined by shining light (UV) through the photo resist. The illuminated areas react by changing their chemical composition. Openings are then washed out after chemically developing the resist. These openings can be used either to etch the underlying material through them or deposit subsequent materials. Thus photoresist acts as a kind of mask. After that the photo resist is removed using solvents.

Other, less conventional techniques may employ a shadow mask as a separate object (not a layer or structure deposited on the wafer). In this case the mask comprises a pattern of perforations defining a structure to be formed on the underlying wafer. Such a mask may also be referred to as a stencil type mask, as opposed to a photo mask. The material is projected from the source through the mask onto the wafer, so as to be deposited only where the mask is perforated (i.e. only where the gaps or holes are). The material then solidifies on the underlying wafer and thus grows a structure on the substrate, with a pattern corresponding to that of the perforations in the mask. On another point of terminology, note that "over" or such like herein does not necessarily mean with respect to gravity, but rather is to be understood in the sense of covering the wafer (or at least part thereof) on the side being worked, i.e. the side upon which the deposition is currently being performed. In the case of the mask this means between the wafer and the source (though not necessarily in physical contact with the wafer). A reciprocal interpretation should also be given to terms such as "underlying".

SUMMARY

As mentioned, the fabrication of most devices involves the deposition of multiple layers over multiple stages. This means different lithography processes will be needed defining the different respective structural patterns of the different layers. To implement this, conventionally one has to break the vacuum, clean the exposed surfaces before the next lithography step, and then re-evacuate the chamber before the next stage of deposition can begin. However, it is recognized herein that this results in non-ideal interfaces between different materials.

Other less conventional techniques use a shadow mask as a separate object, which comprises depositing the material onto the wafer in the patterned form by projecting the deposited material onto the wafer through the mask, rather than using lithography to remove deposited material after deposition. However, to perform multiple stages of deposition using a technique, one would need to break the vacuum, remove the first mask from the vacuum chamber, insert the second mask over the wafer and then re-align the second mask relative to the wafer—all in air, before re-evacuating the chamber for the next stage of deposition. A disadvantage when taking the wafer out of the growth chamber is that the surface reacts with oxygen in the air and gets covered with a layer of oxide (which is often insulating). That oxide then needs to be removed before the next steps are taken. This currently makes such techniques impractical in real applications.

It is recognized herein that it would be desirable to use the currently unconventional shadow mask growth technique, but also to be able to manipulate the masks in-vacuum such as to be able to move into position as second fabrication pattern and align it with a region of interest on the wafer.

This will allow the growth of multiple layers or stages in vacuum without losing the quality of the interface.

According to one aspect disclosed herein, there is provided a method of fabricating at least part of a device in a vacuum chamber, the method comprising: deploying the wafer within the vacuum chamber; applying a mask in a first position over the wafer in the vacuum chamber; following the application of the mask, with the mask in the first position, performing a first fabrication step comprising projecting material onto the wafer through patterned openings in the mask while in vacuum in the vacuum chamber; following the first fabrication step, operating a mask-handling mechanism deployed within the vacuum chamber in order to reposition the mask to a second position while remaining in vacuum in the vacuum chamber, wherein the repositioning comprises receiving readings from one or more sensors sensing a current position of the mask and based thereon aligning the current position of the mask to the second position; and following said repositioning, with the mask now in the second position, performing a second fabrication step comprising projecting material onto the wafer through patterned openings in the repositioned mask while still maintaining the vacuum in the vacuum chamber.

That is to say, by deploying a mechanism within the vacuum chamber itself, it is possible to manipulate the mask without having to break the vacuum. The vacuum remains continuously in place throughout the first fabrication step, repositioning and second fabrication step (and in embodiments subsequent fabrication steps as well). Thus it is possible to avoiding the associated disruption that would otherwise be caused to the fabrication of the structure by breaking the vacuum, by removing and replacing the mask.

The vacuum chamber may be a vacuum deposition chamber. The first and second fabrication steps may comprise a first and second deposition respectively, the projection of the material comprising depositing the material onto the wafer through the respective openings in the mask. Examples of such deposition techniques include molecular beam epitaxy, chemical beam epitaxy, or thin film deposition techniques such as E-beam evaporation or thermal evaporation. The disclosed invention may apply to any such patterned deposition techniques or others. In other alternative applications the fabrication technique may comprise a technique such as ion milling, where the material being projected is the ions which remove patterned regions from a previously-deposited layer.

The mechanism may comprise one or more actuators for producing motion and one or more joints for translating this motion into the repositioning of the mask. In embodiments the actuators may be implemented wholly or partially by a motorized mechanism, such as one or more piezo electric motors. In embodiments some or all of the joints may be implemented in the form of flexure guides (as opposed to pin-based hinges). Such mechanisms or others for producing nanoscale movements are, in themselves, known from other fields such as metrology and thus can be implemented by a person skilled in the art. However to the inventors' knowledge they have not previously been introduced into a vacuum deposition chamber, nor used for the purposes manipulating a shadow mask in-situ.

The device being fabricated may comprise an electronic device, e.g. a semiconductor device. The device may comprise a quantum electronic device such as a computing device. In other embodiments the device may comprise an optical waveguide device. The substrate may for example be semiconductor or insulator. The deposited material may be insulator, conductor, semiconductor or superconductor.

The manipulation may comprise a lateral translation in the plane of the wafer, a lateral rotation in the plane of the wafer, a vertical displacement perpendicular to the plane of the wafer, and/or a tilt relative to the plane of the wafer.

In embodiments said repositioning may comprise feeding the sensor readings back to a computer system arranged to control the mask-handling mechanism, and operating the computer system to automatically perform said alignment based on the sensor readings.

In embodiments the one or more sensors used in the alignment may comprise at least one or more optical sensors In embodiments, the wafer forms a plane and said repositioning may comprise repositioning the mask in a lateral direction parallel to the plane of the wafer, the second position being offset from the first position in the lateral direction.

In embodiments, the mask may comprise first and second fabrication patterns at different lateral positions in the plane of the wafer; wherein in the first position the first fabrication pattern is aligned over a region of interest on the wafer, the first fabrication step thereby forming a corresponding first fabricated structure on the region of interest on the wafer; and in the second position the second fabrication pattern is aligned over said region of interest, the second fabrication step thereby forming a corresponding second fabricated structure on the region of interest on the wafer.

That is to say, the mask comprises multiple different fabrication patterns for a given wafer or region of wafer in the same piece of mask material. The mask is then shifted side-to-side in order to place different patterns over the same region, enabling multiple layers of the wafer to be built up.

Alternatively or additionally, the mask-handling mechanism may be used to correct or re-align the mask part way through a given deposition stage of a given material at a given layer, for example to correct for a thermal expansion of the wafer or mask that may have occurred during fabrication.

In embodiments the method may comprise, prior to the application of the mask, forming an alignment pattern in the mask and a corresponding alignment pattern on the wafer; wherein said alignment may comprise aligning the alignment pattern in the mask relative to the alignment pattern on the wafer. For instance, said alignment may comprise using an optical interference effect formed between the alignment patterns to align the mask in the lateral direction. E.g. the alignment patterns may each comprise a regular array of lines. Said interference effect may comprises a moiré effect formed between the arrays of lines.

The lines of the alignment pattern in the mask may for example be formed as opaque lines in a transparent mask, or perforations or transparent lines in an opaque mask. The corresponding lines in the wafer may be formed for example in the deposited structure of one of the preceding layers, or by a preceding etching or lithographic step.

In embodiments said one or more sensors may comprise at least a microscope, with at least an objective end of the microscope arranged to protrude into the vacuum chamber to view the alignment patterns. For instance, said alignment may be performed based on the interference effect as measured through said microscope.

In embodiments the microscope may be inserted through a sleeve protruding into the vacuum chamber with the sleeve having a sealed observation window at the objective end of the microscope, which keeps the microscope outside the vacuum while maintaining the vacuum in the vacuum chamber when the microscope is inserted, the microscope protruding into the chamber within said sleeve.

This arrangement advantageously allows the microscope to get close to the mask and wafer within the chamber in order to make nanoscale measurements of the alignment. Preferably the microscope is brought within 10 cm of the mask.

In embodiments the microscope and sleeve may be at least partially retractable from the vacuum chamber, the method comprising retracting the microscope and sleeve during the first and second fabrication steps, and extending them into the chamber toward the wafer and mask between the first and second fabrication steps in order to perform said alignment.

Alternatively or additionally, in embodiments the wafer forms a plane and the microscope may be arranged at a non-perpendicular viewing direction relative to the plane of the wafer, and wherein the method comprises using a mirror deployed within the vacuum chamber to direct a view of the alignment patterns toward the viewing direction of the microscope.

In further alternatively or additional arrangements, other forms of reference and/or sensing are possible for performing the alignment. For instance a distance sensor such as a capacitive sensor may be used to measure an offset between an edge of the wafer and an edge of the mask. This however is less preferred since it is more susceptible to errors due to thermal expansion of the mask and/or wafer (such an expansion would result in a relative large error in the overall size and therefore position of the edge of the wafer or mask, compared to the error that would be experienced in an optical interference pattern such as a moiré pattern).

In other implementations it is not excluded that the alignment could be measured optically though an observation window in the chamber rather than a protruding sleeve. However this would require much more powerful optics as the microscope or optical measurement means could not be placed as closely to the sample.

In embodiments the alignment may comprise a coarse alignment performed by reference to visible alignment marks such as crosshairs on the wafer and mask, followed by a fine alignment using the moiré pattern. In embodiments both may be measured using the microscope protruding into the chamber.

In embodiments the wafer forms a plane and said repositioning may comprise one or both of: adjusting a perpendicular displacement of the mask perpendicular to the plane of the wafer, said second position comprising at least a different perpendicular displacement relative to the first position; and/or adjusting a tilt of the mask relative to the plane of the wafer, the second position comprising at least a different angle of tilt compared to the first position.

In embodiments the method may comprise performing the lateral repositioning in a first sub-chamber, and performing the adjustment of the perpendicular displacement and/or tile in a second sub chamber, each sub-chamber comprising a different cavity of the vacuum chamber separated by a vacuum tunnel; and in-between the repositioning in the first sub-chamber and the adjustment in the second sub-chamber, moving the wafer and mask between the sub chambers via the vacuum tunnel.

Alternatively the method may comprise performing both the lateral repositioning, and the adjustment of the perpendicular displacement and/or tilt, in a same cavity of the vacuum chamber.

In embodiments the alignment in relation to the perpendicular displacement and/or tilt may be performed using white light interferometry.

In embodiments the perpendicular displacement and/or tilt may be sensed from outside the vacuum chamber through an observation window in the chamber.

In embodiments the perpendicular displacement and tilt adjustment mechanism may be implemented in the form of a tripod.

In embodiments the vacuum may be at least an Ultra High Vacuum (UHV)—i.e. pressure lower than $10^{-7}$ Pascal.

According to another aspect disclosed herein, there is provided a system comprising: a vacuum chamber for forming a vacuum in the chamber, accepting a wafer within the vacuum, applying a stencil mask over the wafer in the vacuum, and projecting material through the vacuum onto the wafer via the mask; a mechanical mask-handling mechanism deployed within the vacuum chamber, arranged in order to reposition the mask over the wafer while remaining in vacuum in the vacuum chamber; and one or more sensors arranged to receive readings sensing a current position of the mask, the mask-handling mechanism being operable to align the current position of the mask to a target position over the wafer based on the sensor readings.

In embodiments, the system may further comprise features described or claimed as being used in any of the methods disclosed herein.

BRIEF DESCRIPTION OF THE DRAWINGS

To assist understanding of the present disclosure and to show how embodiments may be put into effect, reference is made, by way of example only, to the accompanying drawings in which:

FIG. 6 illustrates an example application of an in-vacuum mask-handling mechanism.

DETAILED DESCRIPTION OF EMBODIMENTS

Figure 1:
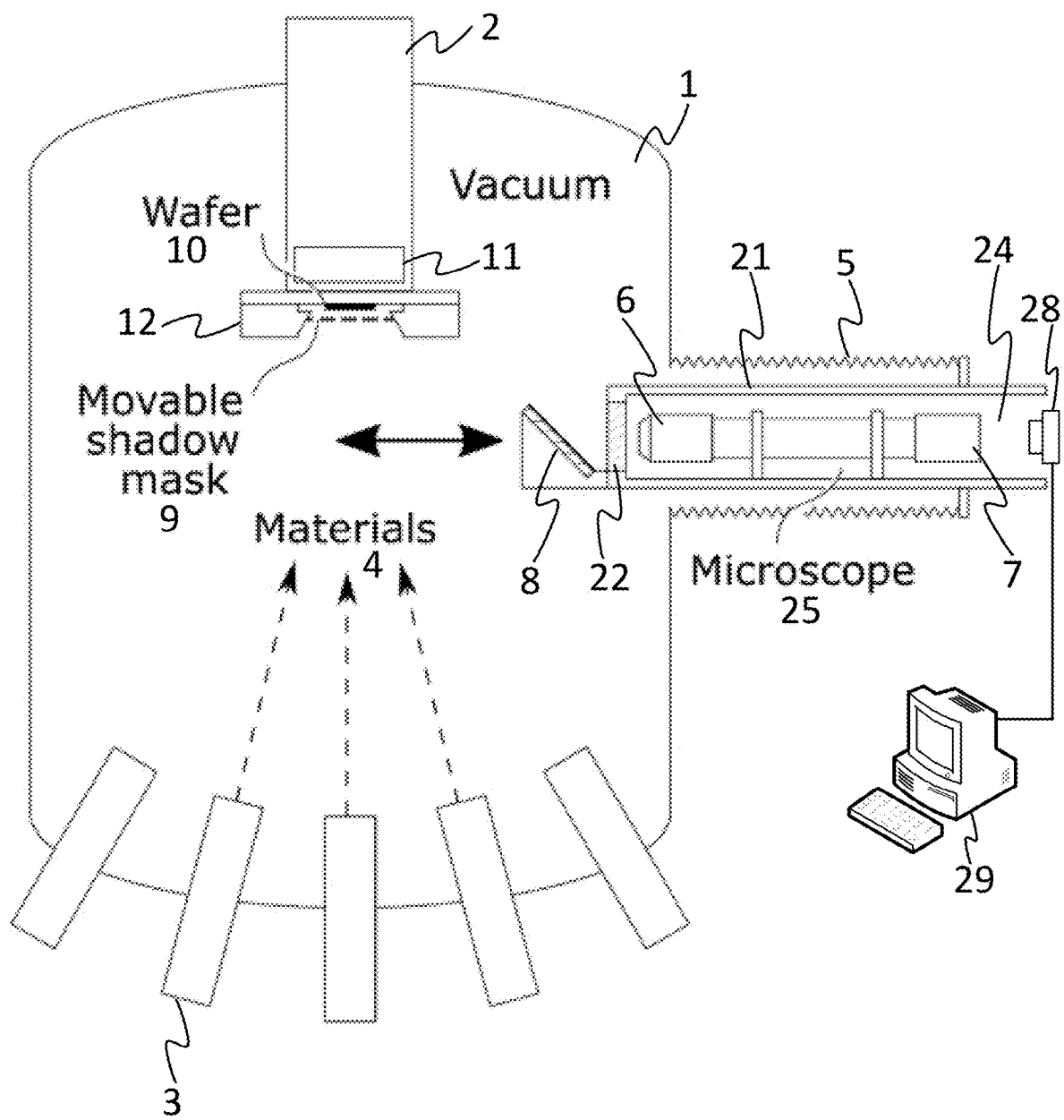
FIG. 1 illustrates an in-situ fabrication chamber with movable shadow masks and microscope for position feedback, wherein a microscope assembly is placed in a retracted position for growth.

Top-down fabrication of nanoscale devices and circuits is prone to generating disorder due to non-ideal interfaces or oxidation caused by multiple stages of deposition. This can be detrimental for realizing large scale devices and applications formed from multiple smaller nanodevices (e.g. arrays of transistors as opposed to single transistor—there is much bigger probability that the whole network will not work due to random error). This is relevant for fields such as quantum electronics and optics. The following discloses a method which allows in-situ device fabrication of multiple stages in vacuum (e.g. UHV) in the material growth chamber, by deploying a high precision positioning motor mechanism in the chamber and arranging this mechanism to position shadow masks over the wafer. This thereby at least partially overcomes the issue of disorder originating from ex-situ fabrication steps. For instance this is advantageous in producing high quality nanoscale networks. In embodiments the method employs optical interference to align the shadow masks in-situ in the vacuum.

The disclosed techniques thus allow multiple steps of patterned growth or deposition of materials through pre-defined patterns in shadow masks in vacuum, in order to form a desired patterned structure on a wafer, without necessarily requiring the use of post growth ex-situ fabrication. The motorized mask-handling stage is arranged to precisely align the mask with pre-existing features on the wafer, which were formed in previous steps, and to be used to grow a plurality of successive patterns without taking the wafer out of vacuum, and while keeping mutual alignment between mask and wafer. An advantage of such bottom-up fabrication is that arbitrary patterns can be grown without using lithography methods including polymers and other spin-on materials, and also without using chemical etching, physical etching or other top-down etching processes that potentially disrupt the crystal structure or introduce impurities.

Previously realized shadow mask growth systems rely on static masks, which cannot be changed, moved or re-aligned at microscopic levels in-situ, without breaking vacuum. Other prior techniques include, for example, formed permanent mesa structures on the substrate, which cast shadows for the material beams. In other cases, the shadow masks have been implemented on a separate medium, brought in a close contact with the substrate, but without the possibility to do precise alignment or shifting. Ability to align the mask in vacuum to existing structures on the substrate or to precisely shift the mask, containing multiple patterns, to the next pattern and grow the subsequent patterned layers, greatly increases the possibility of in-situ fabrication of multi-layered structures (in embodiments up to fully in-situ device fabrication).

The disclosed method can be employed for example in a molecular beam epitaxy chamber or other vacuum deposition chambers where the growth species travel in unidirectional beams and can be shadowed by purposely designed shadow masks.

Absolute alignment of the mask with respect to the substrate can be done with a motorized stage (e.g. using piezoelectric motors). The specific relative movement is performed by aligning the mask to the wafer using alignment marks on both the mask and the wafer. In embodiments the alignment marks on mask and wafer are arranged between them to form an optical interference pattern such as a moiré pattern, and the alignment is then performed using feedback from the resulting optical interference signal. One possible embodiment of a growth chamber in accordance with the present disclosure is shown in FIG. 1, to be discussed in more detail shortly. Here the shadow mask 9 is depicted below the wafer 10 ("over" the wafer 10 in the sense meant herein), and enables formation of high resolution patterns on the wafer 10.

A microscope 25 can be inserted into the vacuum chamber in order to provide feedback on the relative alignment of the mask and the substrate, e.g. based on the optical interference pattern. For this a microscope may be employed having a long distance working distance (WD) relative to conventional microscopes which have a WD of a few mm or up to a couple cm. In embodiments, to be able to look through a vacuum viewport, a microscope with lens having WD of the order of 10 cm may be used, which is sometimes called a "long working distance microscope" (or just "high resolution lens").

The movable shadow masks are mounted on a shadow mask manipulator 12, preferably equipped with nanometric accuracy position feedback systems. Such a mask manipulator allows for precise translations and tilts to position the shadow mask with respect to the wafer 10 using precision mechanics such as piezo electric actuators, flexure guides and other means of nanometric translations and/or rotations. The alignment between the mask and the substrate may be done using the long distance optical microscopy system, which allows detection of the matching alignment marks on the mask and the substrate. Alternatively or additionally, the displacement feedback may be measured using state-of-the-art, nanometric-resolution absolute position sensors, such as capacitive probes, eddy current probes, strain gauges, laser interferometers or other applicable displacement measurement devices. In embodiments, standard cross-hair alignment marks are first used together with standard optical microscopy inspection to coarse align the mask to the wafer to within a few micrometers, and then further nanometric techniques such as those mentioned above are used to fine align.

In embodiments, to perform the nanometric alignment of the mask 9 with the wafer 10, both mask and wafer comprise pre-fabricated matching alignment patterns in form of linear or concentric gratings, that create an optical moiré pattern when superimposed on each other. An optical image of the gratings and the moiré pattern will be analysed with the dedicated computer software and will be used to extract the relative position of the mask relative to the wafer with a resolution that greatly exceeds the resolving power of the microscope.

For high quality material growth the wafer typically should be kept at specific temperatures, significantly below or above the room temperature. Significant changes of temperature cause expansion or contraction of most known materials and would generally cause thermal drift between the mask and the substrate. In embodiments, this issue is addressed by using the above-mentioned absolute alignment technique employing the moiré patterns and optical microscopy (whereas other techniques such as capacitive sensing, strain gauges and interferometers which measure displacement by reference to, say, the position of the edge of the wafer and the edge of the mask, will be more susceptible to the error in the overall size of the wafer and/or mask due to thermal expansion). In embodiments, the measured position feedback is used to compensate the relative position of the mask with respect to the substrate using the precision mechanics of the mask-handling stage 12 until the temperature stabilizes to the acceptable levels.

In embodiments, one or more displacement sensors such as capacitive sensors, strain gauges and/or laser interferometers may still be used in addition to the optical alignment pattern, because these still have some other advantages, despite not being as useful to fully get rid of the thermal drift. For example, they are faster and can be useful for high speed control of a piezo motor, reducing motor nonlinearities and vibrations.

In order to grow the smallest possible features through the shadow mask 9, the mask should ideally be positioned as close as possible to the substrate, preferably within few μm. In embodiments such accurate positioning may be realized by employing a high resolution kinematic mechanism that allows adjustment of not just the lateral displacement and/or rotation of the mask (in the plane of the wafer), but also the distance and angle between the mask and the wafer (in the direction perpendicular to the plane of the wafer). Measurement of this distance and tilt may be performed for example using optical interference methods such as white light interferometry, optical triangulation, confocal or other optical profiling tools. Long distance white light interferometry measurement may be performed through a vacuum viewport and provides high resolution three dimensional view of the mask and the substrate. Measurements of the tilt and relative distance may then be performed automatically and the necessary correction applied using the mechanical actuators.

Further details of some example implementations of the presently disclosed techniques will now be discussed in more detail with reference to FIGS. 1 to 5.

As illustrated in FIG. 1, the system comprises a vacuum chamber 1 in which the method is performed, preferably an ultra high vacuum (UHV) chamber. The chamber 1 is evacuated to form a vacuum within the chamber. The chamber 1 comprises a sample support 2 for supporting the wafer 10 in the vacuum inside the vacuum chamber 1 during the deposition process.

In embodiments the sample support 2 takes the form of a sample manipulation column. The chamber 1 also comprises one or more source cells 3, each comprising a quantity of a material 4 to be deposited but in its source form, e.g. a solid or liquid. In embodiments, the deposition technique used is molecular beam epitaxy (MBE). Techniques such as Molecular Beam Epitaxy (MBE) in combination with a UHV chamber can give a high material purity and quality. In embodiments employing MBE or such like, each source cell 3 comprises a compartment holding the source material and having an opening out into the vacuum chamber 1. Each source cell 3 also comprises energization means to energize the source material, such as by heating, to thereby cause the material 4 to be ejected from the cell into the chamber in the form of a beam, towards the wafer 10 held on the sample support 2. For example the energization means may take the form of an effusion cell or an electron beam evaporator. For instance in an effusion cell the material is heated by an electrical heating coil, and the material then diffuses out through a small aperture (this is called effusion). In an e-beam evaporator the material is energized by a beam of accelerated electrons. The deposition material 4 may be ejected in the form of directional beam of molecules or atoms.

As usual in such types of MBE chambers or the like, the wafer 10 is supported on the sample manipulation column 2 with its surface facing the material source(s) 3 in order to accept the material being deposited therefrom. In embodiments the wafer manipulation column 2 also contains a temperature regulation device 11 which allows to cool or heat the wafer 10 to required temperatures.

The substrate of the wafer 10—may for example be a semiconductor such as Si, InAs, InP, GaAs, or InSb. The material being deposited may for example be a metal (e.g. Au or Al), a superconductor (e.g. Al), a ferromagnet (e.g. EuS) or a semiconductor (e.g. InSb or InAs).

The vacuum chamber 1 further comprises, disposed in the vacuum inside the chamber, a mask support 12 arranged to hold a mask 9 in position over the wafer 10 during deposition. The mask 9 may for example be made of low vapour pressure materials, such as a Si3N4 membrane supported by a Si wafer frame. The wafer 10 defines a plane and the mask is also substantially planar, arranged over the wafer 10 substantially parallel to the plane of the wafer 10. Again it is noted that "over" herein means covering for the purpose of masking the deposition, i.e. between wafer 10 and source 3 (not necessarily relative to gravity). The mask 9 is like a stencil, having solid parts that block the beam of deposited material and a pattern of holes or perforations (i.e. openings) which pass the beam of deposited material through onto the underlying wafer 10, thus allowing the material to form on the wafer in the pattern defined by the holes in the mask 9. Such a pattern in the mask 9 may be referred to herein as the fabrication pattern. The fabrication pattern in the mask 9 may for example be formed by etching the mask in a preliminary step prior to deposition.

In addition to the standard MBE components or the like, according to embodiments of the present disclosure, the mask support 12 comprises a mask handling stage, which not only supports the mask 9 but also enables its position to be manipulated in one or more dimensions in-situ over the wafer 10 whilst maintaining the vacuum in the vacuum chamber 3 (i.e. without having to break the vacuum in order to move the mask 9). The mask handling stage 12 contains actuators and sensors for performing mask shifts with nanometric position accuracy. Positioning mechanisms capable of positioning objects to nanometre precision are, in themselves, known from other applications such as metrology. However according to the present disclosure, such a mechanism is installed inside the vacuum chamber 1 and arranged to manipulate the mask 9 over the wafer. In embodiments for example the actuators of the mask-handling stage 12 may be implemented in the form of piezoelectric motors. The mask-handling stage 12 may be configured to translate the motion generated by the motors into the desired movement of the mask via flexure guides (a hinge formed from a thin, continuous piece of flexible material, rather than a pin-and-knuckle type hinge). The flexures guides hold the weight of the mechanism, guide and amplify the movement of the piezo (like a lever arm).

In embodiments, precise alignment of the mask 9 with the wafer 10 is ensured by the use of an optical microscope 25, which is inserted into the vacuum chamber 1 through a sleeve 21. The sleeve 21 takes the form of any tunnel, conduit or channel (e.g. a solid tube) at least partially protruding into the main cavity of the vacuum chamber 1, but sealed from it, with a viewing window 22 at the end of the sleeve 21 which protrudes into the chamber 1. The sleeve 21 is formed from materials capable of withstanding the pressure difference between the inside and outside the chamber. At the other end 24 of the sleeve 21 to the viewing window 22, the sleeve 21 is open to allow insertion of the microscope 25. The microscope 25 is inserted into the sleeve 21 with the objective end 6 of the microscope 25 (the distal end, i.e. the end for capturing the images of the sample) protruding into the chamber 1 toward the end of the sleeve with the viewing window 22, so as to be able to sample images of the mask 9 over the wafer 10 through the viewing window 22 of the sleeve 21. In embodiments the microscope 25 and sleeve 21 are not perpendicular to the plane of the wafer 10 but a mirror 8 is arranged inside the vacuum chamber 1, arranged to direct images of the mask 9 over the wafer 10 toward the objective end 6 of the microscope 25 through the viewing window 22 when the microscope 25 is inserted into the sleeve 21. The mirror 8 may be attached to the end of the sleeve 21 which protrudes inside the chamber 1.

The other end of microscope 25, the viewing end 7 (proximal end), is arranged to be viewable through the opening 24 at the open end of the sleeve 21. A digital camera 28 is arranged to capture the images formed at the viewing end 7 of the microscope 25, and thereby capture the images of the mask 9 over the wafer 10 for the purpose of alignment.

The digital camera 28 is coupled to a computer system 29 and arranged to send the captured images to the computer system 29 for processing. The computer system 29 is arranged to automatically control the mask-handling stage 12 to align the mask 9 over the wafer 10 based on the images captured by the camera 28, which provide feedback of the mask's current position. The computer system 29 may take the form of a single computer terminal or a larger system, such as a server comprising one or more physical server units at one or more geographical locations (where required, distributed computing techniques will in themselves known to a person skilled in the art).

Figure 2:
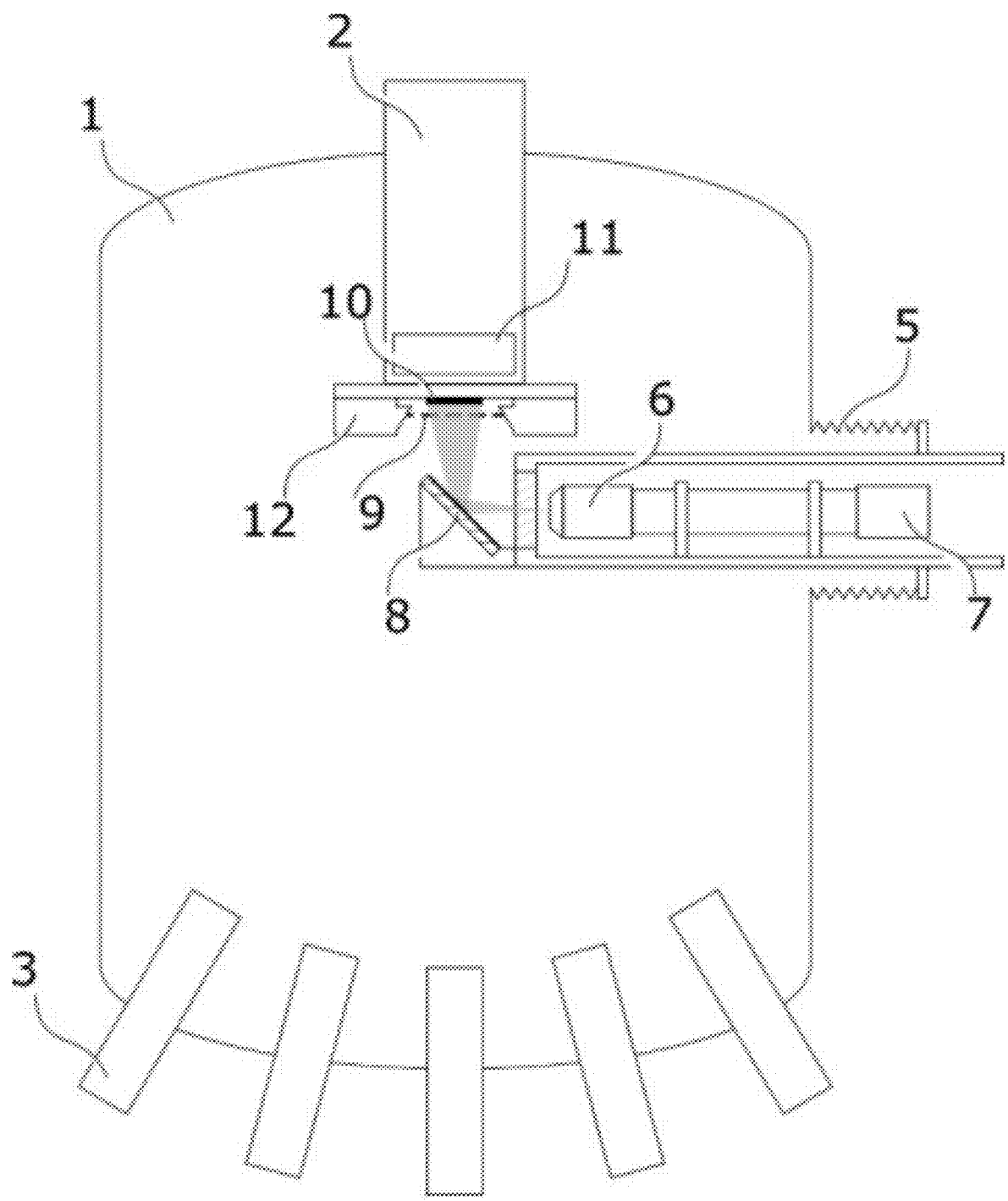
FIG. 2 illustrates the in-situ fabrication chamber with the optical microscope extended for precise alignment of the mask and the wafer.

In one implementation, as illustrated in FIG. 2, the vacuum chamber 1 comprises a bellow type mechanism 5 (i.e. a concertina mechanism) arranged around the sleeve 21, to enable the sleeve 21 (and with it the microscope 25) to be selectively extended into and retracted from the chamber 1. If a mirror is used the mirror 8 may also extend with the sleeve 21, being attached to it. This arrangement advantageously allows the objective end 6 of the microscope 25 to get close to the mask 9 and wafer 10 when the microscope 25 and sleeve 21 are extended, in order to perform the alignment prior to deposition. Preferably the objective end 6 of the microscope should be brought within about 10 cm of the visible surface of the mask 9. The microscope 25 and its sleeve 21 can then be moved out of the way of the wafer 10 and mask 9 during deposition. In the example arrangement shown in FIG. 2 the microscope 25 is inserted horizontally, and the images of the mask 9 and the wafer 10 are taken from below via a mirror 8. Alignment is done before growth, since the microscope and the mirror would block the growth materials from arriving at the wafer 10. After performing the alignment, the microscope 25 is then retracted into a position where it does not block the materials 4, as shown in FIG. 1.

Figure 3:
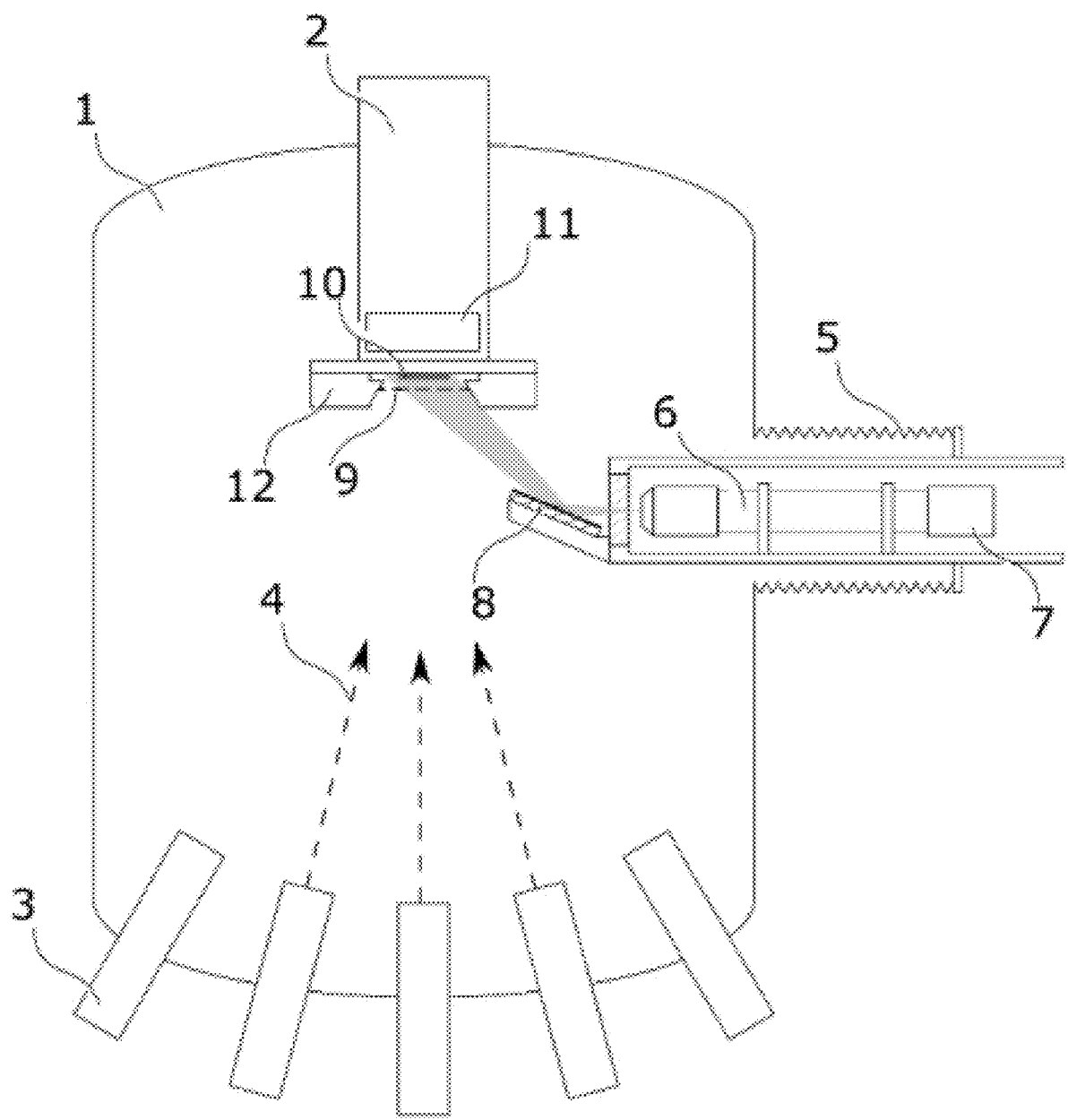
FIG. 3 illustrates an alternative implementation of the in-situ fabrication chamber with a tilted microscope viewing axis so as not to obstruct the growth materials.

In an alternative implementation illustrated in FIG. 3, the arrangement of the microscope 25, sleeve 21 and mirror 8 does not necessarily have to be extendable or retractable. Instead, the viewing direction may be at an angle with respect to the normal of the mask 9 and the wafer 10. I.e. the objective end of the microscope assembly 8, 21, 25 in the viewing position does not fall between the source 3 and wafer 10, but instead the mirror 8 is angled to direct the images of the mask 9 over the wafer 10 toward the objective end 6 of the microscope 25, which is offset form the axis between the source 3 and wafer 10. In this way, the microscope assembly 8, 21, 25 does not block the incoming materials 4. This allows the computer system 29 to keep the control of the mask position in a closed loop with the feedback from the microscope 25 during the growth process (in embodiments throughout the entire growth process), thus minimizing potential thermal drifts that may occur during the growth process.

Figure 4:
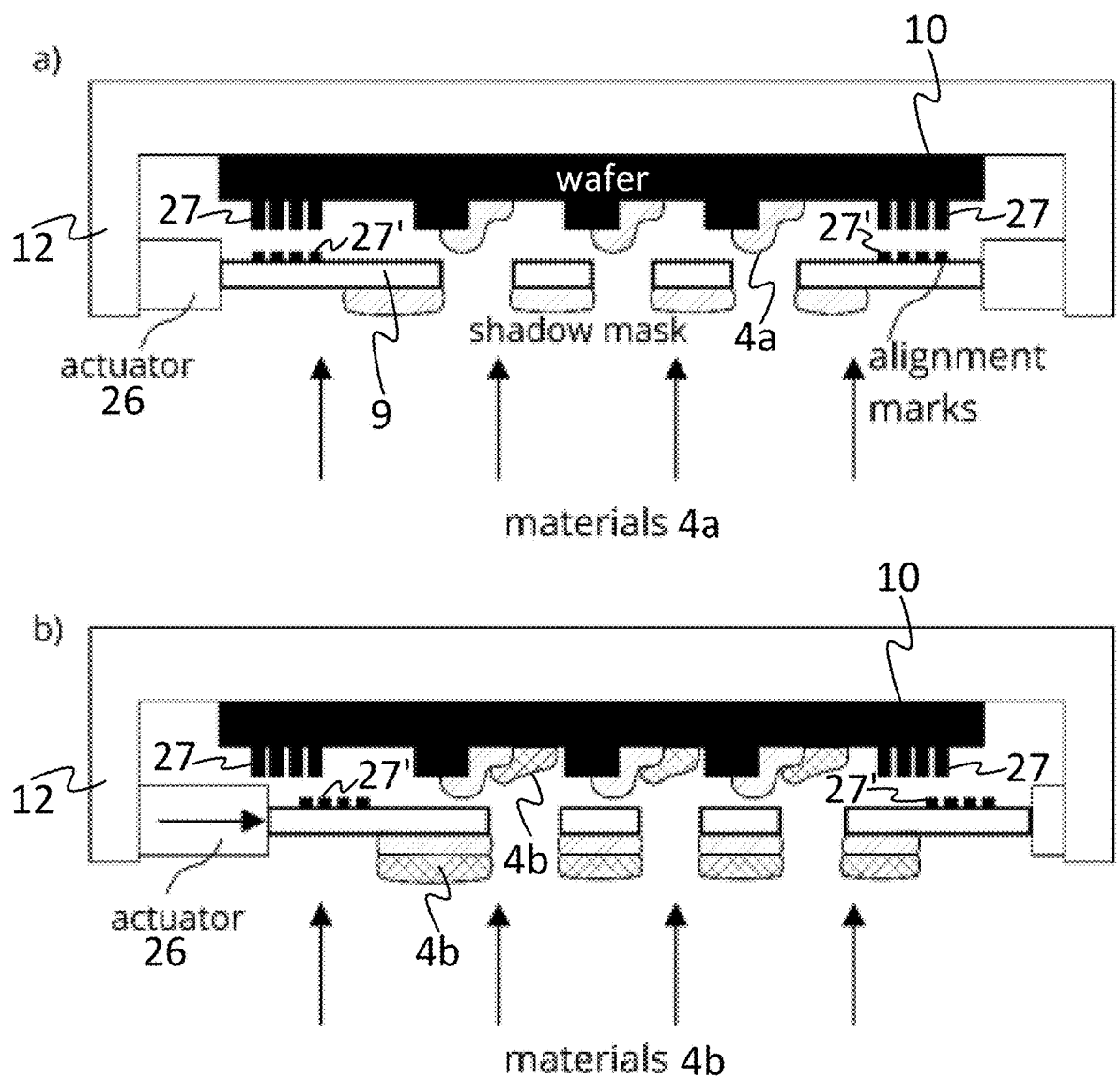
FIG. 4 illustrates steps of an in-situ fabrication process, employing a shift of the shadow mask using piezo-electric actuators between (a) deposition of the first layer and (b) deposition of the second layer after the mask was shifted.

FIG. 4 illustrates an example of the process of lateral repositioning and fine lateral alignment of the mask 9 in-situ during fabrication.

The functional design of many nano-electronic or optical devices requires combining different materials, such as semiconductors, metals or insulators with precise mutual positioning and controlled properties. This requires accurate mutual alignment of successive layers, which is commonly done using alignment marks on lithography masks and already existing structures on the wafers. Implementing the bottom-up, in-situ fabrication method of the present disclosure also preferably requires precise absolute alignment of the shadow masks 9 with respect to the existing structures on the wafer 10 as well as precise relative shifting of the mask 9 in order to expose the wafer 10 to the different part of the shadow pattern.

FIG. 4 shows two-steps, during which two different materials 4a, 4b are deposited on the wafer 10. In a first step (a), a first material 4a is deposited on the wafer 10 through the patterned openings in the mask 9. In one example implementation the mask 9 comprises a $Si_3N_4$ membrane, with etched openings and supported on the Si frame. The mask 9 can also comprise a plurality of $Si_3N_4$ membranes on a single frame. The thickness of the membrane is preferably chosen to be of the similar size as the smallest lateral feature size to be grown on the wafer 10. In step (b) the mask 9 is shifted laterally with respect to the original position (i.e. in the plane of the wafer 10), to the position designed for deposition of a second material 4b. This shift is performed inside the growth chamber by engaging the actuators 26 of the mask-handling stage 12 (e.g. piezo electric actuators) and reading out the position using the optical feedback signal from the alignment marks. This procedure may be performed by means of the computer system 29. Note that the shift may in fact be much larger than illustrated in FIG. 4, as will be discussed further shortly in relation to FIG. 6.

Next to the actual fabrication pattern in the mask 9, the mask 9 also includes one or more alignment marks 27' to be used for precise optical alignment with a corresponding one or more marks 27 formed on the wafer 10. The alignment of these marks 27, 27' may be viewed using the microscope 25, preferably arranged as discussed previously in relation to FIGS. 2 and 3. The alignment may be detected automatically by the computer system 29 via the digital camera 28, and the adjustments to the alignment of the mask may be performed automatically by the computer system 29 based on this feedback. That is, the computer system 29 controls the mask-handling stage 12 to adjust the lateral position of the mask 9 over the wafer 10 in dependent on the alignment of the alignment marks 27, 27' as detected via the microscope 25 and camera 28.

In embodiments the alignment marks 27, 27' on the wafer 10 and the mask 9 comprise pairs of grids, which together form an optical moiré pattern that is seen with the optical microscope 25. By choosing the right ratio of the grid periods, the period of the moiré pattern can be much larger than that of the actual grids, thus making the moiré pattern clearly visible with the long working distance optical microscope 25. Any relative movement of the mask 9 with respect to the wafer 10 will cause a phase shift in the moiré pattern, which can be much larger than the actual shift in position of the mask 9 relative to the wafer 10. Thus it is possible to resolve displacements of a few nanometres using a microscope 25 with optical resolution limited to a few micrometres. The computer system 29 detects the shift in the period of the moiré pattern as detected via the microscope 25 and camera 28, and controls the mask-handling stage 12 to adjust the position of the mask 10 accordingly.

The art of using moiré patterns for alignment of lithographical masks and stamps is well known. According to embodiments of the present disclosure however, the use of such patterns is applied in-vacuum in a vacuum deposition based fabrication system. The digital camera 28 takes continuous images of the moiré patterns and provides them to analysis software running on the computer system 29. The analysis software performs detailed image processing, which includes extraction of the Fourier phases of the moiré patterns and calculates relative displacements in two dimensions in real time. The real-time displacement values are provided as a feedback signal for the piezo electric actuators 26, which control the alignment of the mask 9 with the wafer 10 in a closed control loop. Such an implementation mitigates potential thermal drifts which may occur, either when intentionally changing the wafer temperature or due to uncontrolled thermal fluctuations.

Note that the alignment gratings 27, 27' are illustrated only schematically in FIG. 4. In fact the gratings (or other such alignment markings) are formed in the pane of the wafer 10 and mask 9 respectively. In embodiments the mask 9 is transparent and the lines of the alignment grating 27' take the form of opaque lines in the mask 9. Alternatively the mask 9 may be opaque and the alignment grating 27' takes the form of transparent lines or openings in the mask.

In some use cases the lateral mask handling stage 12 may be used as shown in FIG. 4 to offset a given pattern between the first and second deposition steps (a) and (b). This may be used to form a given pattern of material 4a and then form the same pattern with material 4b but offset by a lateral delta. It may also be used to perform a re-alignment part way through the deposition of a given material. However, another use case is to produce a superposition of any two (or more) arbitrary patterns in successive deposition steps (a), (b). This is illustrated in FIG. 6.

As shown in FIG. 6, the mask 9 comprises at least two areas 9A, 9B having respective fabrication patterns formed therein, each pattern being the size and shape of a region of interest 10R on the wafer 10. In general the patterns on the two different mask areas 9A, 9B may be any arbitrary design and need not be the same. The region of interest 10R may be the whole wafer 10 or just a subarea of it. Each area 9A, 9B on the mask also includes its own respective instance of the alignment pattern 27'A, 28'B. In the first deposition step (a), the first fabrication pattern on the first mask area 9A is aligned over the region of interest 10R by aligning the first instance of the alignment pattern 27'A on the mask 9 with the alignment pattern 27 on the wafer 10. In general the alignment pattern could be inside of or outside of the region of interest 10R and the corresponding patterned area on the mask. The first material 4a is deposited onto the region of interest 10R through this first pattern with the mask in this first position. In the second deposition step (b), the second fabrication pattern of the second mask area 9B is then moved in laterally and aligned over the region of interest 10R, by aligning the second instance of the alignment pattern 27'B on the mask 9 with the alignment pattern 27 on the wafer 10. With the mask 9 in this second position, the second material 4B is then deposited through the second pattern onto the region of interest 10R. Thus two successive patterns are formed on top of one another without breaking vacuum.

Figure 5:
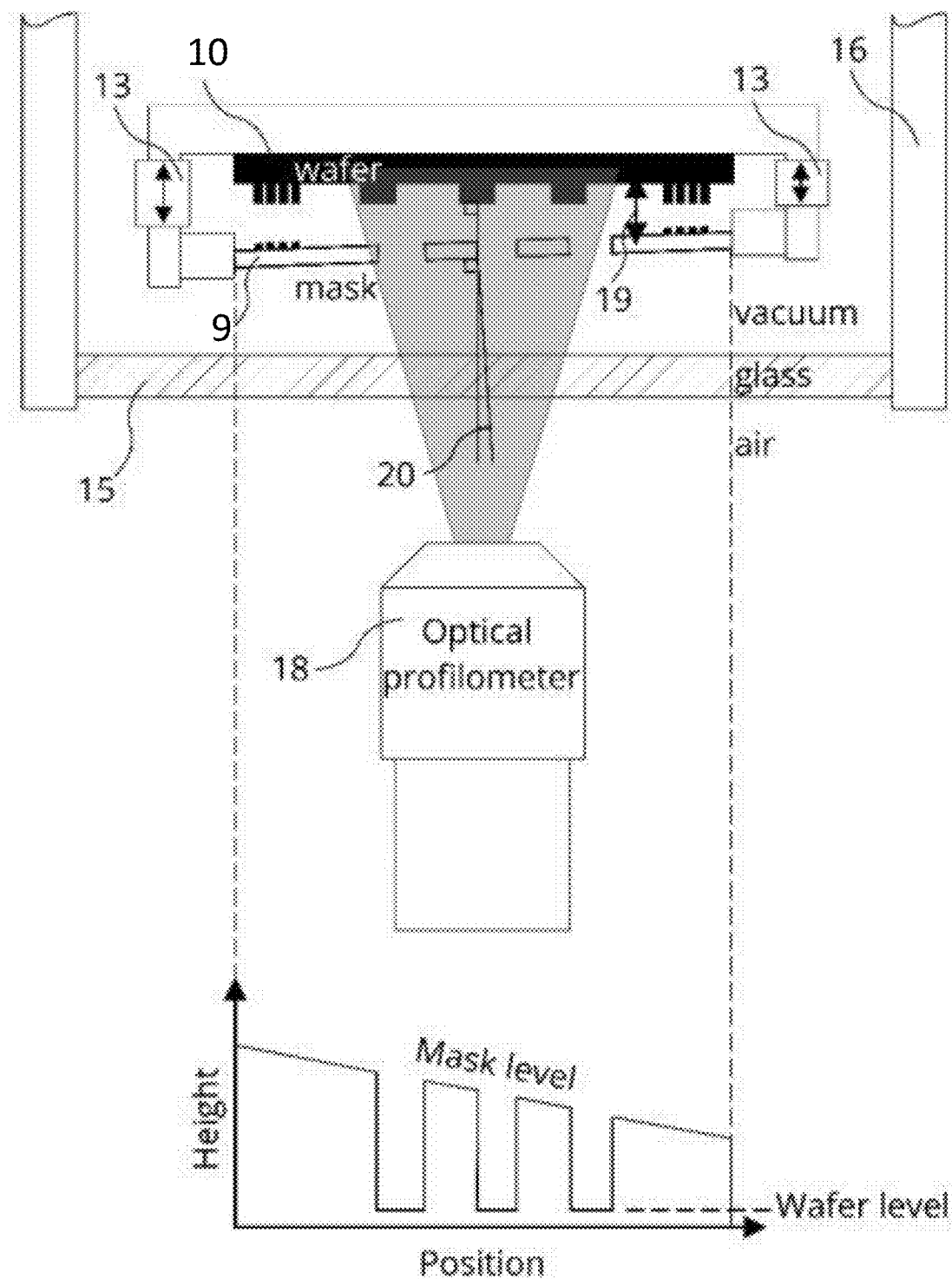
FIG. 5 illustrates a mask alignment chamber which is connected to the main growth chamber via a transfer tunnel, wherein the wafer-mask assembly is put together here using in-vacuum manipulation tools before they are aligned using the feedback from an optical profilometer.

FIG. 5 illustrates an example arrangement for gap and tilt adjustment, i.e. for making adjustments to the position of the mask 9 in the direction normal to the plane of the wafer 10.

In order to grow small features on the wafer 10 through a shadow mask 9, a small distance is desirable in order to minimize the gap between the mask 9 and the wafer 10. FIG. 5 shows a possible implementation of a mask-handling mechanism for controlling the gap 19 and angle 20 between the mask 9 and the wafer 10 with possible accuracy better than 1 μm. In embodiments the adjustment of the angle 20 between the wafer 10 and the mask 9, as well as of the gap between them, is performed in a different vacuum sub chamber 16, which is connected via a UHV tunnel to the main MBE cavity of the chamber 1. The mechanical assembly of the mask 9 and the wafer 10, shown in FIG. 5, may be assembled in the mentioned sub chamber 16 by means of standard UHV manipulators and wobble sticks. The sub-chamber is equipped with a viewport 15 which allows observation of the mask 9 and the wafer 10 with sufficiently short working distance using optical microscopy.

The gap and tilt adjustment may be performed using a parallel kinematic mechanism 13 in addition to the lateral mechanism used in the main chamber 1. Together with the lateral manipulation mechanism 12, these may be considered as different components (albeit in embodiments in different sub-chambers) of a wider mask-handling mechanism for manipulating the mask in at least three degrees of freedom (lateral displacement, perpendicular displacement and tilt). In embodiments, the height and tilt adjustment mechanism 13 consists of three piezo-electric actuators, operating in a tripod configuration. This allows to adjust two tilt angles and the gap independently. In embodiments, stick-slip piezoelectric actuators may be used, which has an advantage that the set position is kept by stiction forces after turning off the voltage from the piezoelectric actuators. This allows one to disconnect the cables for the piezoelectric actuators after setting the gap and tilt of the mask 9 with respect to the wafer in the sub-chamber 16 and then transfer the mask-wafer assembly 9, 10 to the main growth chamber 1. In alternative implementations, the height and tilt adjustment could be implemented as manually adjustable micrometer screws, accessible with the vacuum manipulation tools (an in-vacuum screwdriver).

To precisely align the gap and/or tilt of the mask 9 with respect to the wafer 10 using the above-mentioned tripod mechanism, reliable and accurate feedback is required. In the proposed implementation a vacuum viewport 15 is provided in the sub-chamber 16 to allow optical inspection of the mask-wafer assembly. In embodiments this optical inspection comprises the use of an optical profilometer 18 which operates based on white light interference, i.e. a white light interferometer (WLI). White light interferometry is based on shining white light on a target and measuring the constructive and destructive interference caused by its reflections received back at the interferometer at the various frequencies present in the white light. In this way the WLI 18 may be used to measure the three dimensional profile of the mask 9 and the underlying wafer 10 through the openings in the mask 9, or through the mask 9 itself if the mask is transparent to the type of light used by the WLI 18. The three dimensional dataset provides the relative position and orientation of the mask with respect to the wafer with very high vertical resolution (typically a few nm), as well as a sufficient lateral resolution (μm) in order to perform an initial coarse lateral alignment. FIG. 5 shows an example outcome of such measurement using WLI, where the mask 9 and the wafer 10 are seen as the regions offset in terms of height. In this illustration the mask 9 is tilted with respect to the wafer 10. Both tilt and the gap can be deduced from the single measurement.

Alternatively, other depth measurement tools can be used, such as tools based on structured light, triangulation or optical interference. For instance in one embodiment a triangulation-based sensor may be used. This device emits a laser spot or laser line onto the measured surface. The position of the spot or line is then viewed at an angle with respect to the illumination direction. The position of the spot or line is sensitive to the profile of the surface. This way one can measure the distance between the mask 9 and the wafer 10 at a single point or a line across the mask. Additional measurement points can be taken by shifting the measurement device and taking measurements at several positions. In another embodiment, a gap sensor can be placed in the retractable sleeve 21 next to the microscope 25, or in another retractable sleeve, in order to measure the gap in situ and if required correct it using the motorized stage.

The corresponding gap and tilt corrections may then be then applied based on these measurements, e.g. using the above-mentioned piezoelectric actuators 13. In embodiments this process may again be controlled by the computer system 29. After the gap and tilt adjustment is finished, the power from the stick-slip actuators can be switched off, without significant changes in their position. This allows one to unplug the cables and freely transport the mask-wafer assembly through the vacuum tunnel to the main MBE growth chamber 1 for further alignment and growth.

In an alternative implementation, a WLI with sufficiently long working distance could be used in order to perform the gap and angle alignment inside the MBE chamber. This would allow control of the gap and the angle between the mask and the wafer just before, or even during, growth.

It will be appreciated that the above embodiments have been described by way of example only.

For instance, the applicability of the disclosed techniques is not limited to different first and second materials 4a, 4b. Alternatively or additionally the repositioning of the mask 9 may be performed between two stages of deposition of the same material, e.g. to form a structure that cannot be defined by a single patterning stage using a single mask in a single position (e.g. a complete ring structure cannot be formed in single step by a single stencil). Also the applicability of the disclosed techniques is not limited to being used to deposit different first and second patterns. Alternatively or additionally, the mask-handling mechanism may be used to correct a lateral alignment, perpendicular displacement and/or tilt during a given patterning step without breaking vacuum, e.g. to correct for thermal expansion occurring mid fabrication.

Further, the implementation is not limited to the use of the moiré pattern or microscope 25 to measure the lateral displacement, nor the WLI 18 to measure the perpendicular displacement or tilt. Other types of high precision sensing are also possible. For example a distance sensor such as a capacitive sensor may be used to measure the relative offset between the edge of the wafer 10 and the edge of the mask 9. Other suitable displacement measurement technologies include eddy current probes, strain gauges, and laser interferometers. Where an optical effect is used, this is not limited to a moiré effect. For example an optical encoder may instead be used.

Where a microscope 25 is used this is not limited to the particular arrangement shown in FIG. 2 or 3. For instance the microscope 25 could be arranged to view the mask 9 and wafer 10 directly rather than via a mirror 8. Further, rather than being inserted through a sleeve 21, the microscope 25 and camera 28 could be deployed fully inside the chamber 1. Where alignment is performed by reference to alignment markings on the wafer 10 and mask 9, these are not limited to gratings forming a moiré pattern. For instance cross hair type alignment markers could be used with a high enough resolving power of microscope 25.

With regard to measuring the perpendicular displacement and/or tilt, this is not limited to white light interferometry (WLI). Other techniques that would alternatively or additionally be used include for example structured light, triangulation, spectral interferometry, or confocal techniques. For instance a triangulation sensor can be used as as a cheaper alternative to the WLI.

The disclosed methods of in-vacuum mask-handling are not limited to use in molecular beam epitaxy, and may also be employed in any other fabrication applications that employ deposition through a mask in a vacuum chamber. For instance the in-vacuum mask handling can also be applied to chemical beam epitaxy, or to thin film deposition systems such as E-beam evaporation, thermal evaporation or Ion milling (the latter involving milling rather than growth, which can be also used with masks).

Further, though preferred, it is not essential to provide manipulation in all three degrees of the freedom of lateral displacement, perpendicular displacement and tilt relative to the plane of the wafer 10. Even providing one or some such types of manipulation will still be beneficial, e.g. to correct at least some alignment issues that may occur mid fabrication. Further, the manipulation is not limited to the types described. For example, alternatively or additionally, the mask-handling stage 12 may be arranged to perform a lateral rotation of the mask 9 in the plane of the wafer 10. Further, in embodiments which provide both i) lateral translation in the pane of the wafer 10 and ii) perpendicular displacement and/or tile relative to the plane of the wafer 10, these are not limited to being performed in separate sub-chambers 1, 16. In an alternative arrangement a mask-handling mechanism providing for all of these degrees of freedom could be incorporated together in the same mask-handling stage in the main chamber 1.

Furthermore, automated control by the computer system 29 is not essential. It is also not excluded that the adjustments by the mask-handling mechanism alignment could be set manually by an operator viewing the sensor readings and inputting appropriate settings accordingly.

Other variants may become apparent to the person skilled in the art once given the disclosure herein. The scope of the present disclosure is not limited by the disclosed embodiments but only by the accompanying claims.

The invention claimed is:

1. A method of fabricating at least part of a device in a vacuum chamber, the method comprising:
    deploying a wafer within the vacuum chamber;
    applying a mask in a first position over the wafer in the vacuum chamber;
    following the application of the mask, with the mask in the first position, performing a first fabrication step comprising projecting material onto the wafer through patterned openings in the mask while in vacuum in the vacuum chamber;
    following the first fabrication step, operating a mask-handling mechanism deployed within the vacuum chamber in order to reposition the mask to a second position while remaining in vacuum in the vacuum chamber, wherein the repositioning comprises receiving readings from one or more sensors sensing a current position of the mask and based thereon aligning the current position of the mask to the second position; and
    following said repositioning, with the mask now in the second position, performing a second fabrication step comprising projecting material onto the wafer through patterned openings in the repositioned mask while still maintaining the vacuum in the vacuum chamber.

2. The method of claim 1, wherein said repositioning comprises feeding the sensor readings back to a computer system arranged to control the mask-handling mechanism, and operating the computer system to automatically perform said alignment based on the sensor readings.

3. The method of claim 1, wherein the one or more sensors used in said alignment comprise at least one or more optical sensors.

4. The method of claim 1, wherein the wafer forms a plane and said repositioning comprises repositioning the mask in a lateral direction parallel to the plane of the wafer, the second position being offset from the first position in the lateral direction.

5. The method of claim 4, wherein the one or more sensors used in said alignment comprise at least one or more optical sensors, and wherein:

the mask comprises first and second fabrication patterns at different lateral positions in the plane of the wafer;

in the first position the first fabrication pattern is aligned over a region of interest on the wafer, the first fabrication step thereby forming a corresponding first fabricated structure on the region of interest on the wafer; and in the second position the second fabrication pattern is aligned over said region of interest, the second fabrication step thereby forming a corresponding second fabricated structure on the region of interest on the wafer.

6. The method of claim 3, further comprising:

prior to the application of the mask, forming an alignment pattern in the mask and a corresponding alignment pattern on the wafer wherein said alignment comprises aligning the alignment pattern in the mask relative to the alignment pattern on the wafer.

7. The method of claim 6, wherein the one or more sensors used in said alignment comprise at least one or more optical sensors, and wherein said alignment comprises using an optical interference effect formed between the alignment patterns to align the mask in the lateral direction.

8. The method of claim 7, wherein the alignment patterns each comprises a regular array of lines.

9. The method of claim 8, wherein said interference effect comprises a moiré effect formed between the arrays of lines.

10. The method of claim 7, wherein said one or more sensors comprise at least a microscope, with at least an objective end of the microscope arranged to protrude into the vacuum chamber to view the alignment patterns.

11. The method of claim 10, wherein:

the wafer forms a plane and said repositioning comprises repositioning the mask in a lateral direction parallel to the plane of the wafer, the second position being offset from the first position in the lateral direction;

the method comprises, prior to the application of the mask, forming an alignment pattern in the mask and a corresponding alignment pattern on the wafer, wherein said alignment comprises using an optical interference effect formed between the alignment patterns to align the mask in the lateral direction; and said alignment is performed based on the interference effect as measured through said microscope.

12. The method of claim 11, wherein the microscope is inserted through a sleeve protruding into the vacuum chamber with the sleeve having a sealed observation window at the objective end of the microscope, which keeps the microscope outside the vacuum while maintaining the vacuum in the vacuum chamber when the microscope is inserted, the microscope protruding into the chamber within said sleeve.

13. The method of claim 1, wherein the wafer forms a plane and said repositioning comprises one or both of:

adjusting a perpendicular displacement of the mask perpendicular to the plane of the wafer, said second position comprising at least a different perpendicular displacement relative to the first position; and/or adjusting a tilt of the mask relative to the plane of the wafer, the second position comprising at least a different angle of tilt compared to the first position.

14. The method of claim 13, wherein the alignment in relation to the perpendicular displacement and/or tilt is performed using white light interferometry.

15. A system comprising:

a vacuum chamber for forming a vacuum in the chamber, accepting a wafer within the vacuum, applying a stencil mask over the wafer in the vacuum, and projecting material through the vacuum onto the wafer via the mask;

a mechanical mask-handling mechanism deployed within the vacuum chamber, arranged in order to reposition the mask over the wafer while remaining in vacuum in the vacuum chamber; and one or more sensors arranged to receive readings sensing a current position of the mask, the mask-handling mechanism being operable to align the current position of the mask to a target position over the wafer based on the sensor readings.

16. The method of claim 12, wherein the microscope and sleeve are at least partially retractable from the vacuum chamber, the method comprising retracting the microscope and sleeve during the first and second fabrication steps, and extending them into the chamber toward the wafer and mask between the first and second fabrication steps in order to perform said alignment.

17. The method of claim 10, wherein the wafer forms a plane and the microscope is arranged at a non-perpendicular viewing direction relative to the plane of the wafer, and wherein the method comprises using a mirror deployed within the vacuum chamber to direct a view of the alignment patterns toward the viewing direction of the microscope.

18. The method of claim 13, wherein the wafer forms a plane and said repositioning also comprises repositioning the mask in a lateral direction parallel to the plane of the wafer, the second position being offset from the first position in the lateral direction; and wherein the method comprises:

performing the lateral repositioning in a first sub-chamber, and performing the adjustment of the perpendicular displacement and/or tile in a second sub chamber, each sub-chamber comprising a different cavity of the vacuum chamber separated by a vacuum tunnel; and in-between the repositioning in the first sub-chamber and the adjustment in the second sub-chamber, moving the wafer and mask between the sub chambers via the vacuum tunnel.

19. The method of claim 13, wherein the wafer forms a plane and said repositioning also comprises repositioning the mask in a lateral direction parallel to the plane of the wafer, the second position being offset from the first position in the lateral direction; and wherein the method comprises:

performing both the lateral repositioning, and the adjustment of the perpendicular displacement and/or tilt, in a same cavity of the vacuum chamber.

20. The method of claim 13, wherein the perpendicular displacement and/or tilt are sensed from outside the vacuum chamber through an observation window in the chamber.

* * * * *